United States Patent
Chen et al.

(10) Patent No.: US 9,992,906 B2
(45) Date of Patent: Jun. 5, 2018

(54) SLIDE RAIL ASSEMBLY AND OPERATION METHOD THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Hsiao-Han Lu, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days. days.

(21) Appl. No.: 15/296,326

(22) Filed: Oct. 18, 2016

(65) Prior Publication Data
US 2017/0208942 A1    Jul. 27, 2017

(30) Foreign Application Priority Data
Jan. 22, 2016  (TW) .............................. 105102163 A

(51) Int. Cl.
*F16C 29/12* (2006.01)
*H05K 7/18* (2006.01)
*A47B 88/04* (2006.01)
*A47B 88/08* (2006.01)
*A47B 88/16* (2006.01)
(Continued)

(52) U.S. Cl.
CPC .............. *H05K 7/183* (2013.01); *A47B 88/00* (2013.01); *A47B 88/044* (2013.01); *A47B 88/08* (2013.01); *A47B 88/16* (2013.01); *A47B 88/493* (2017.01); *F16C 29/123* (2013.01); *A47B 2210/0016* (2013.01); *F16C 2314/72* (2013.01); *Y10T 16/625* (2015.01)

(58) Field of Classification Search
CPC .... F16C 29/02; F16C 29/123; F16C 2314/72; A47B 88/08; A47B 2210/0081; H05K 7/183; H05K 7/1489; Y10T 16/373; Y10T 16/361; Y10T 16/625
USPC ........ 384/18–22, 23, 36; 248/429, 569, 573; 16/85, 94 R
See application file for complete search history.

(56) References Cited

U.S. PATENT DOCUMENTS 6,655,763 B2   12/2003 Judge et al.
6,854,816 B2   2/2005  Milligan
(Continued)

FOREIGN PATENT DOCUMENTS

| EP | 2238866 A1 | * | 10/2010 | ........... A47B 88/493 |
| GB | 2401534 A | * | 11/2004 | ........... A47B 88/487 |
| JP | 2012055689 A | * | 3/2012 | ........... H05K 7/1489 |

*Primary Examiner* — Marcus Charles
(74) *Attorney, Agent, or Firm* — Rosenberg, Klein & Lee

(57) ABSTRACT

A slide rail assembly includes first to third rails and an engaging mechanism movably mounted on the second rail. The second rail is displaceable with respect to the first rail, and the third rail is displaceable with respect to the second rail. The three rails define a length when the second rail is displaced from a first to a second position in a first direction and the third rail, to a third position in the same direction, extending out of the second rail. Once the second rail is displaced from the second to a fourth position in a second direction, the length is reduced, and the second rail is kept at the fourth position by the engaging mechanism.

14 Claims, 13 Drawing Sheets

(51) Int. Cl.
*A47B 88/00* (2017.01)
*A47B 88/493* (2017.01)

(56) References Cited

U.S. PATENT DOCUMENTS

| | | | |
|---|---|---|---|
| 6,997,529 B1 | 2/2006 | Chen et al. | |
| 7,101,081 B2* | 9/2006 | Chen | A47B 88/493 |
| | | | 312/334.46 |
| 7,654,624 B2* | 2/2010 | Huang | A47B 88/49 |
| | | | 312/333 |
| 7,857,403 B2* | 12/2010 | Chen | A47B 88/493 |
| | | | 312/333 |
| 8,303,052 B2* | 11/2012 | Chen | A47B 88/493 |
| | | | 312/319.1 |
| 8,328,300 B2* | 12/2012 | Yu | A47B 88/43 |
| | | | 312/333 |
| 8,403,436 B2* | 3/2013 | Yu | H05K 7/1489 |
| | | | 312/333 |
| 8,925,883 B2 | 1/2015 | Fan et al. | |
| 9,328,769 B1 | 5/2016 | Chen et al. | |
| 2008/0141496 A1* | 6/2008 | Peng | A47B 88/40 |
| | | | 16/94 R |
| 2009/0001864 A1* | 1/2009 | Huang | A47B 88/49 |
| | | | 312/333 |
| 2009/0169140 A1* | 7/2009 | Chen | A47B 88/493 |
| | | | 384/21 |
| 2011/0091141 A1* | 4/2011 | Liang | H05K 7/1489 |
| | | | 384/20 |
| 2011/0262060 A1* | 10/2011 | Yu | H05K 7/1489 |
| | | | 384/21 |
| 2012/0061551 A1* | 3/2012 | Zhang | H05K 7/1489 |
| | | | 248/560 |
| 2012/0163740 A1* | 6/2012 | Yu | H05K 7/1489 |
| | | | 384/21 |
| 2014/0072248 A1* | 3/2014 | Chen | A47B 88/47 |
| | | | 384/20 |

* cited by examiner

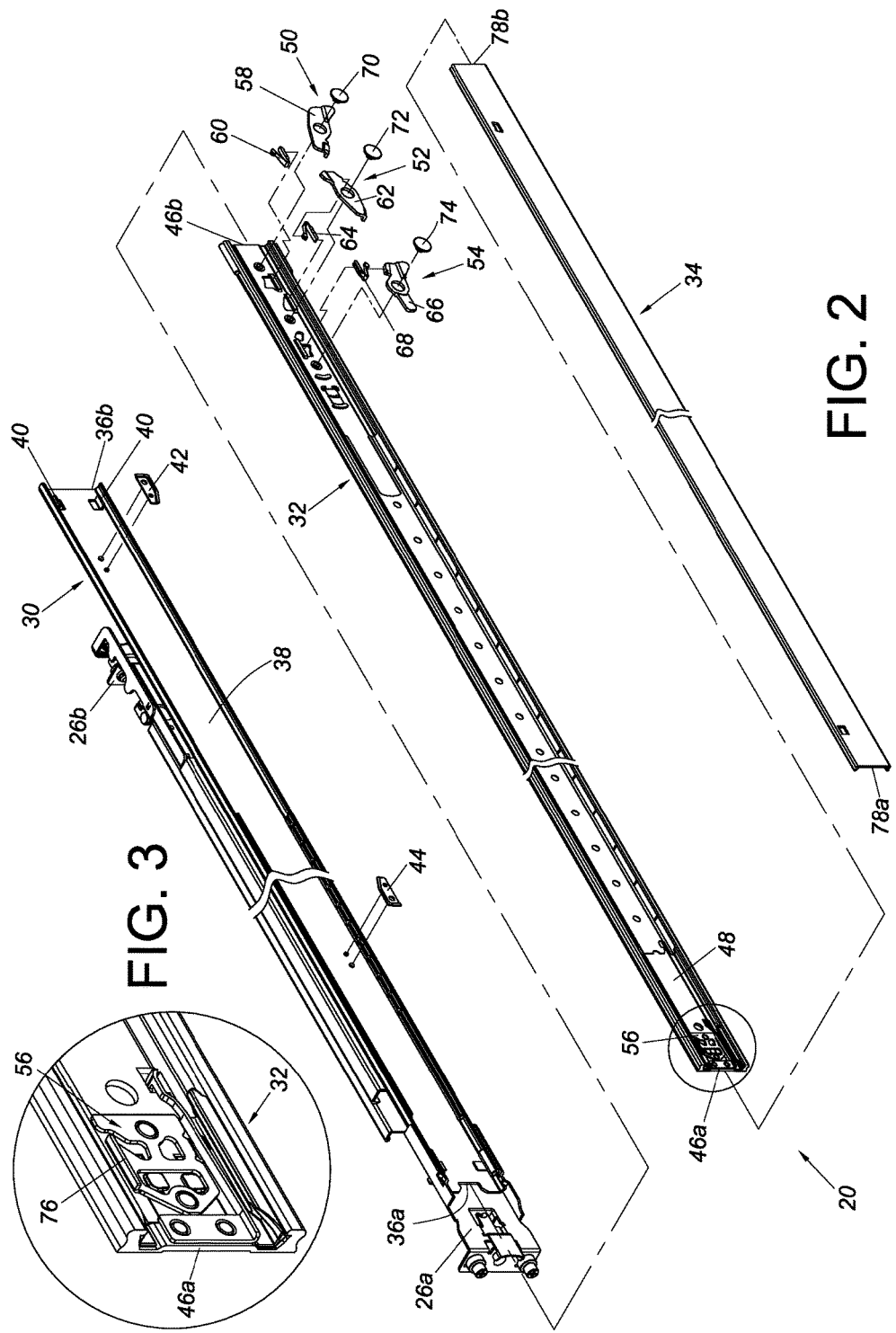

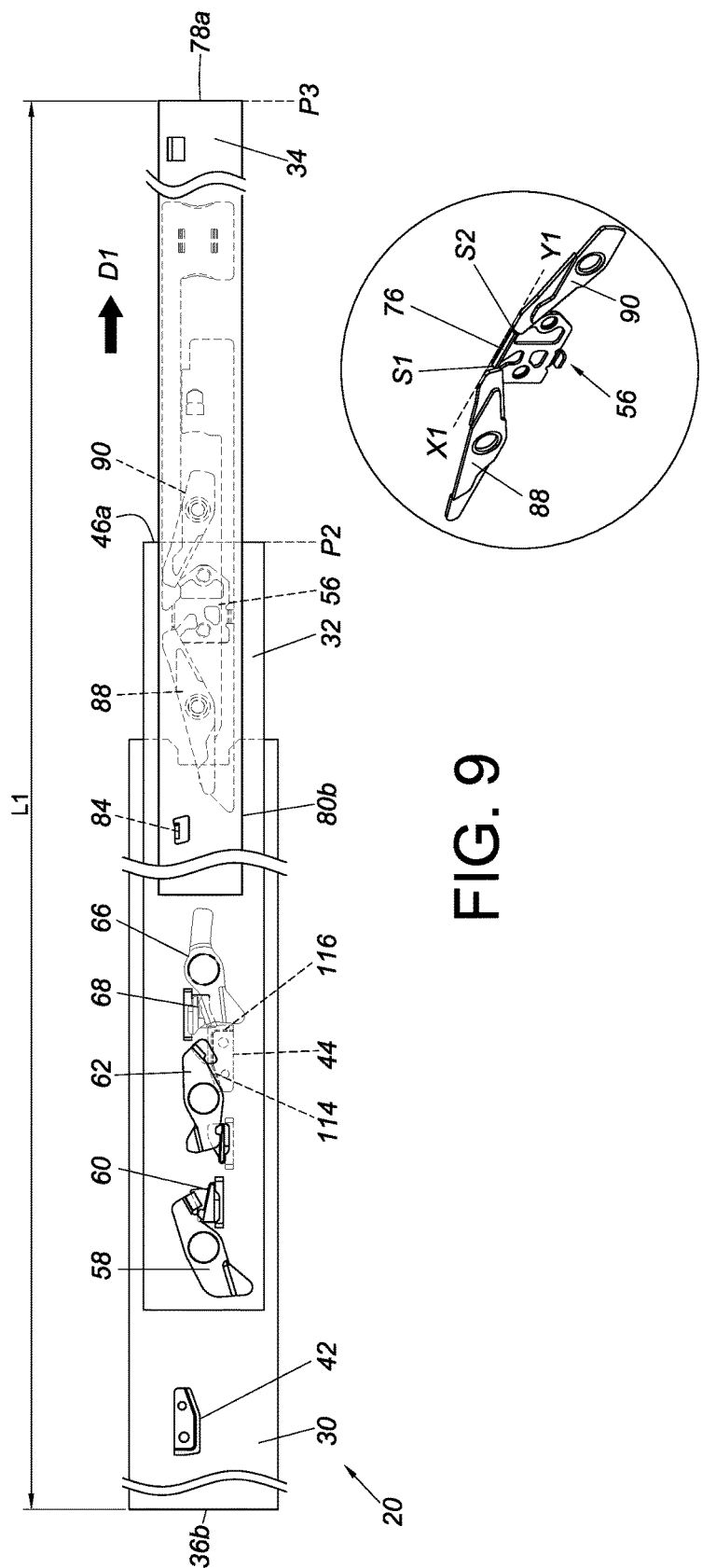

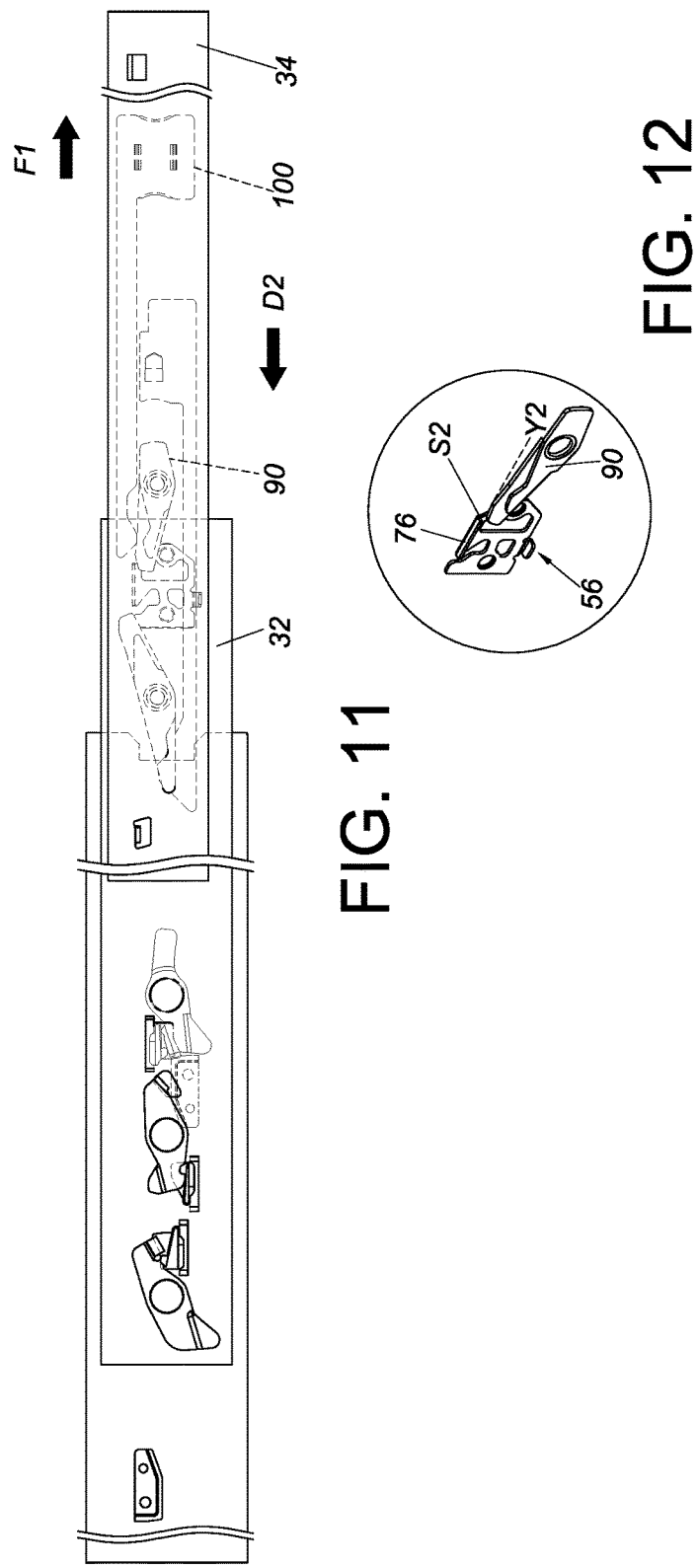

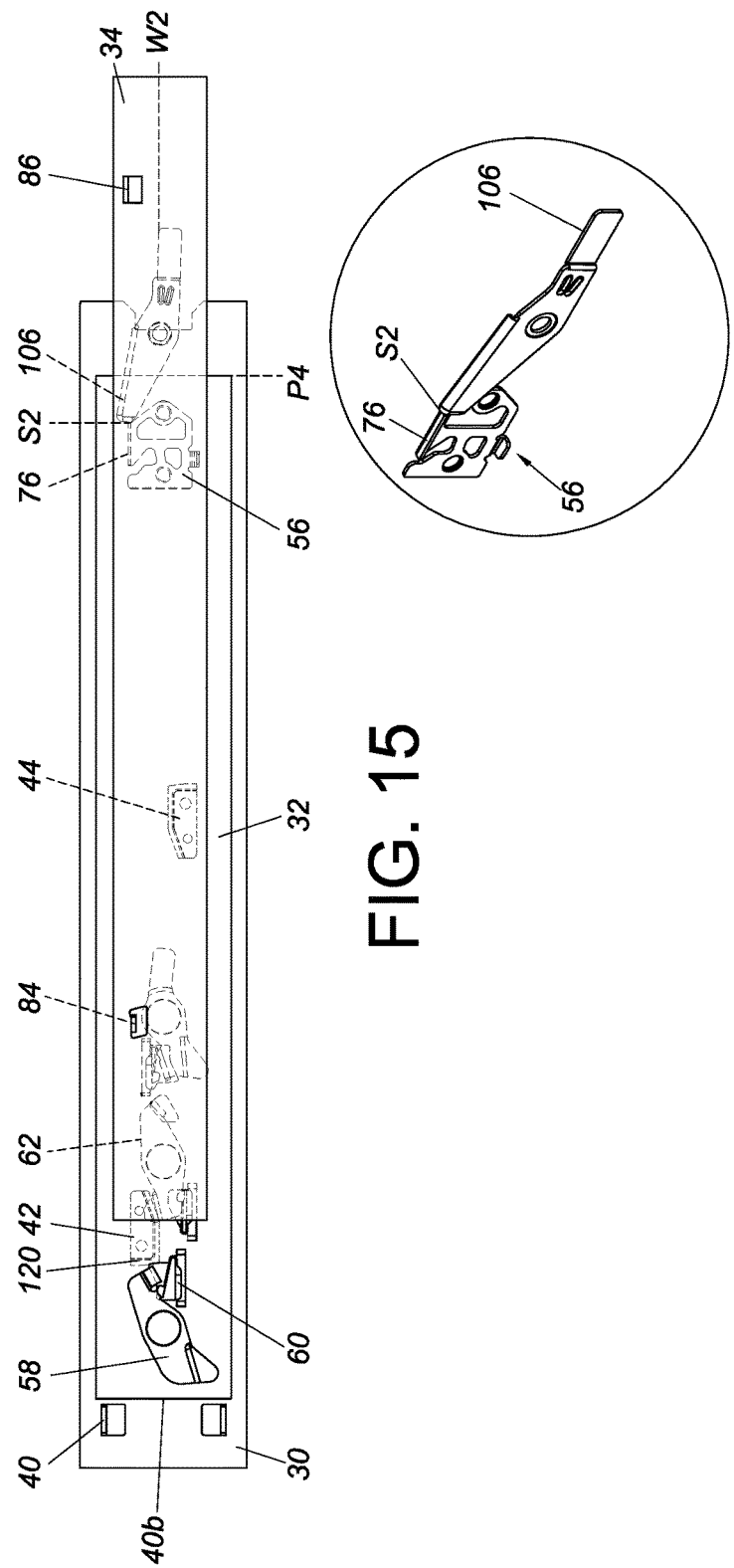

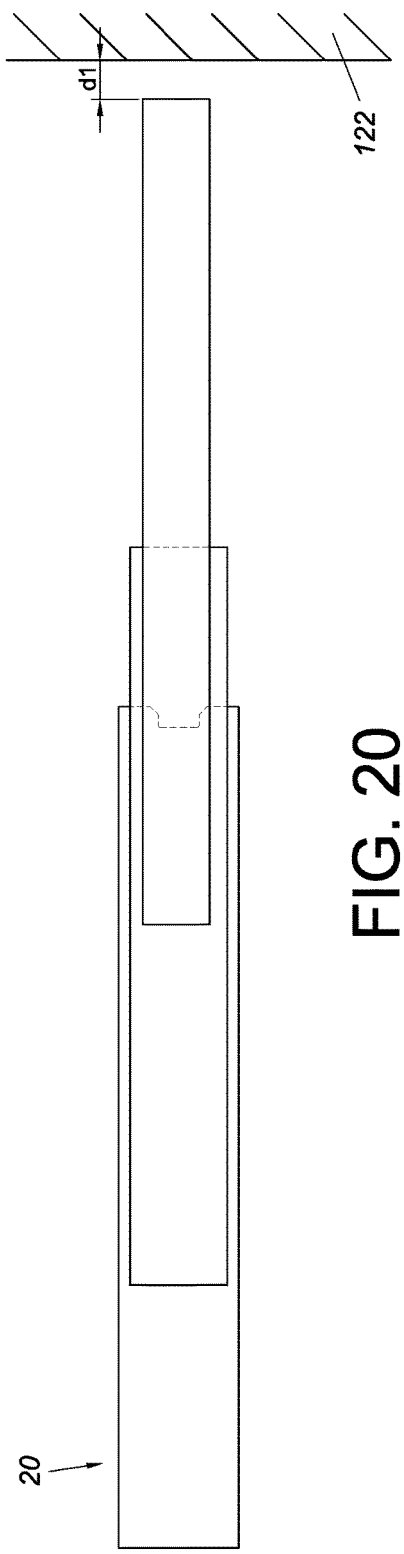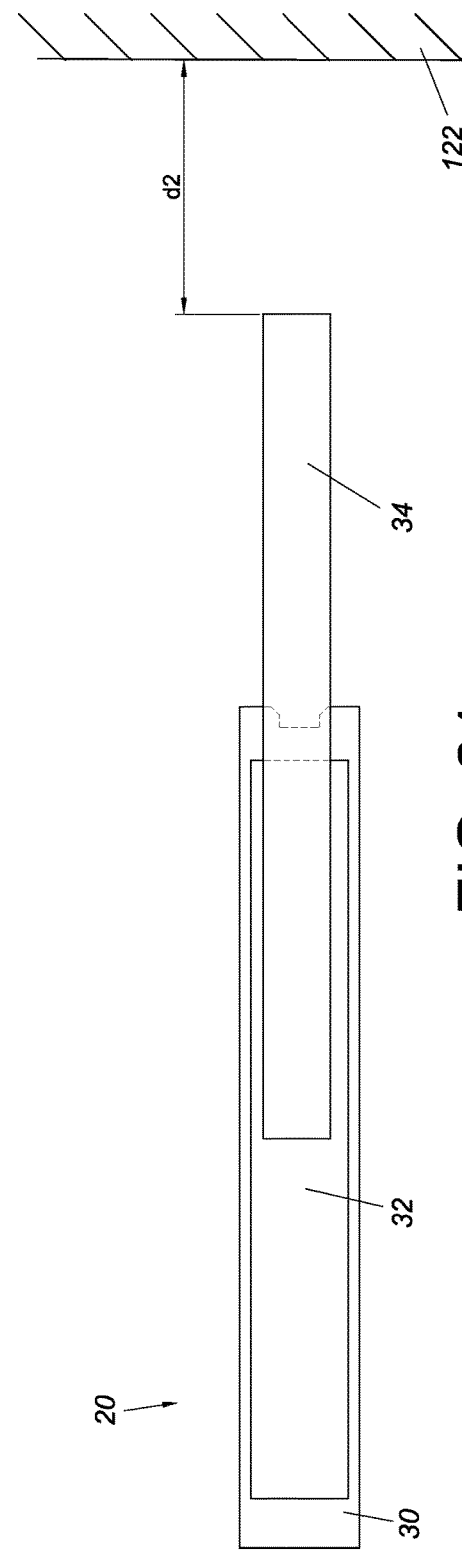

SLIDE RAIL ASSEMBLY AND OPERATION METHOD THEREOF

FIELD OF THE INVENTION

The present invention relates to a slide rail assembly and more particularly to one whose extended length can be reduced to facilitate installation and removal of a rail of the slide rail assembly in a space-limited environment.

BACKGROUND OF THE INVENTION

A slide rail assembly typically includes at least two rails which can be displaced with respect to each other to bring the slide rail assembly into an extended or retracted state. Take a three-part slide rail assembly with a first rail, a second rail, and a third rail for example. Usually, the slide rail assembly has a fully extended length when the second rail and the third rail have been displaced with respect to the first rail in a predetermined direction to their respective fully extended states, and the second rail can stay at a fully extended position with respect to the first rail once the slide rail assembly reaches the fully extended length.

If it is desired, however, to keep the second rail of such a slide rail assembly temporarily at a partially extended position with respect to the first rail, the slide rail assembly will have problem satisfying this particular need.

SUMMARY OF THE INVENTION

The present invention relates to a slide rail assembly whose extended length can be shortened to facilitate maintenance of the slide rail assembly in a space-limited environment.

The present invention also relates to a method for operating a slide rail assembly. The method is designed to shorten the extended length of the slide rail assembly so that the slide rail assembly can be used in a space-limited environment.

According to one aspect of the present invention, a slide rail assembly includes a first rail, a second rail, a third rail, and a first engaging mechanism. The first rail has a front end and a rear end. The second rail can be displaced with respect to the first rail. The third rail can be displaced with respect to the second rail and has a front end and a rear end. The first engaging mechanism is movably mounted on the second rail. When the second rail is displaced from a first position to a second position with respect to the first rail in a first direction and the third rail is displaced to a third position with respect to the second rail in the first direction and therefore extends out of the second rail, the rear end of the first rail and the front end of the third rail define a first length therebetween. When the second rail is displaced from the second position to a fourth position in a second direction, the first length between the rear end of the first rail and the front end of the third rail is reduced to a second length, and the second rail is kept at the fourth position with respect to the first rail by the first engaging mechanism.

Preferably, the slide rail assembly further includes a first working member and a stopping base. The first working member is mounted on the third rail and can be displaced between a first working position and a second working position by user operation. The stopping base is arranged on the second rail and has a stopping portion. When the third rail is displaced to a predetermined position in the first direction, the first working member is in the first working position and is pressed against one side of the stopping portion of the stopping base. Once displaced from the first working position to the second working position by user operation, the first working member is no longer pressed against the stopping portion of the stopping base, so the third rail can be detached with respect to the second rail.

Preferably, the slide rail assembly further includes a second working member elastically mounted on the third rail. The second working member is displaced along the stopping portion of the stopping base while the third rail is being displaced to the predetermined position in the first direction. Once moved past the stopping portion of the stopping base, the second working member is pressed against another side of the stopping portion of the stopping base.

Preferably, the slide rail assembly further includes a switching member mounted on the third rail. The switching member can be displaced between a first switching position and a second switching position by user operation. The switching member is not aligned with the stopping portion of the stopping base when in the first switching position but is aligned with the stopping portion of the stopping base when in the second switching position.

Preferably, the third rail has a front stop spaced from the switching member.

Preferably, the slide rail assembly further includes a first stopping member arranged on the first rail, and the second rail is pressed against the first stopping member via the first engaging mechanism when at the fourth position.

Preferably, the first engaging mechanism includes a first engaging member and a first elastic member for applying an elastic force to the first engaging member. The first engaging member is pressed against the first stopping member by the elastic force of the first elastic member when the second rail is at the fourth position.

Preferably, the slide rail assembly further includes a second stopping member and a second engaging mechanism, and the third rail has a rear stop. The second stopping member is arranged on the first rail and includes a disengaging portion. The second engaging mechanism is movably mounted on the second rail. The third rail can push the second engaging mechanism via the rear stop and thereby simultaneously displace the second rail from the first position in the first direction until the disengaging portion of the second stopping member disengages the second engaging mechanism from the rear stop.

Preferably, the second engaging mechanism includes a second engaging member and a second elastic member for applying an elastic force to the second engaging member, and the third rail can push the second engaging member via the rear stop.

Preferably, the second stopping member further includes a position-limiting portion, and the slide rail assembly further includes a third engaging mechanism movably mounted on the second rail. The third engaging mechanism is adjacent to the position-limiting portion of the second stopping member when the second rail has been displaced to the second position.

Preferably, the third engaging mechanism includes a third engaging member and a third elastic member for applying an elastic force to the third engaging member. The third engaging member is adjacent to the position-limiting portion of the second stopping member in response to the elastic force of the third elastic member when the second rail is displaced to the second position.

According to another aspect of the present invention, a slide rail assembly adapted for mounting an object to a rack includes a first rail, a second rail, a third rail, a first stopping member, a first engaging mechanism, and a first working member. The first rail is mounted on the rack and has a front end and a rear end. The second rail can be displaced with respect to the first rail, and the third rail, with respect to the second rail. The third rail is configured to carry the object and has a front end and a rear end. The first stopping member is arranged on the first rail. The first engaging mechanism is movably mounted on the second rail. The first working member is mounted on the third rail and can be displaced between a first working position and a second working position by user operation. When the second rail is displaced from a first position to a second position with respect to the first rail in a first direction and the third rail is displaced to a third position with respect to the second rail in the first direction and therefore extends out of the second rail, the rear end of the first rail and the front end of the third rail define a first length therebetween. Once the second rail is displaced from the second position to a fourth position in a second direction, the first length between the rear end of the first rail and the front end of the third rail is reduced to a second length, and the second rail is kept at the fourth position with respect to the first rail by the first engaging mechanism. After the first working member is displaced from the first working position to the second working position by user operation, the third rail can be detached with respect to the second rail.

According to yet another aspect of the present invention, a method for operating a slide rail assembly includes the steps of: providing a first rail; providing a second rail, which can be displaced from a first position to a second position with respect to the first rail in a first direction; providing a third rail, which can be displaced with respect to the second rail to a third position beyond the second position; providing a first working member, which can be displaced between a first working position and a second working position by user operation, wherein when the first working member is in the first working position, the third rail is at the third position with respect to the second rail such that the first rail, the second rail, and the third rail define a first length; providing a first engaging mechanism such that, when the second rail is displaced from the second position to a fourth position with respect to the first rail in a second direction, the first engaging mechanism keeps the second rail at the fourth position with respect to the first rail, thereby reducing the first length to a second length; and displacing the first working member from the first working position to the second working position by user operation when the second length prevails, so that the third rail can be detached with respect to the second rail.

Preferably, the step of providing the first working member includes providing a stopping base to the second rail, and the stopping base has a stopping portion such that, when the third rail is so displaced in the first direction that the first working member is in the first working position, the first working member is pressed against a side of the stopping portion of the stopping base.

Preferably, the method further includes the step of providing a first stopping member to the first rail such that the second rail is pressed against the first stopping member via the first engaging mechanism when at the fourth position.

BRIEF DESCRIPTION OF THE DRAWINGS

FIG. 2 is an exploded perspective view of one of the slide rail assemblies in FIG. 1;

FIG. 3 is a partial enlarged view of the second rail of the slide rail assembly in FIG. 2, showing in particular the stopping portion of the stopping base;

FIG. 9 shows that the third rail in FIG. 8 is displaced with respect to the second rail in the first direction, that the second engaging member of the second engaging mechanism is tilted by an angle by the disengaging portion of the second stopping member, and that the third engaging member of the third engaging mechanism is adjacent to the position-limiting portion of the second stopping member;

FIG. 10 is a perspective view showing the first working member and the second working member in FIG. 9 pressed against two opposite sides of the stopping portion of the stopping base respectively;

FIG. 11 shows that the second working member in FIG. 9 can be operated in order not to be pressed against the stopping portion of the stopping base;

FIG. 12 is a perspective view showing that the second working member in FIG. 11 is not pressed against the stopping portion of the stopping base;

FIG. 15 shows how the switching member in FIG. 14 drives the second rail to a certain position while the third rail is displaced in a second direction;

FIG. 16 is a partial perspective view of FIG. 15, showing the switching member pressed against the stopping portion of the stopping base;

FIG. 20 shows the slide rail assembly in FIG. 2 in a first extended state, in which a first space exists between the slide rail assembly and an ambient object; and FIG. 21 shows the slide rail assembly in FIG. 20 in a second extended state, in which a second space exists between the slide rail assembly and the ambient object.

DETAILED DESCRIPTION OF THE INVENTION

Figure 1:
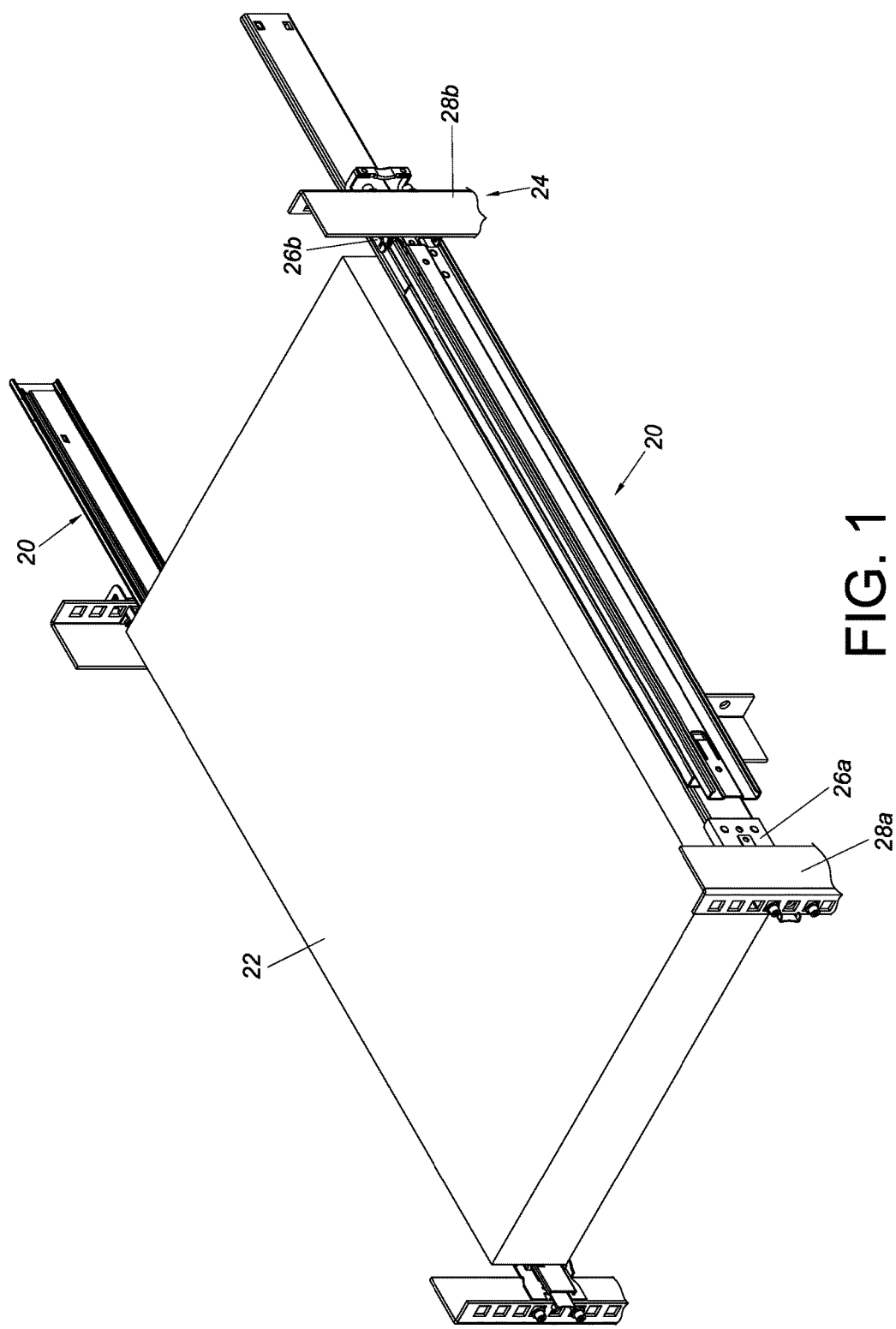
FIG. 1 is a perspective view showing how a pair of slide rail assemblies in an embodiment of the present invention mount an object to a rack.

Referring to FIG. 1, the pair of slide rail assemblies 20 in an embodiment of the present invention are configured to mount an object 22 to a rack 24. More specifically, each slide rail assembly 20 can be mounted to a first post 28a and a second post 28b of the rack 24 via a first bracket 26a and a second bracket 26b respectively. The foregoing arrangement is well known in the art and therefore is not dealt with in more detail herein for the sake of simplicity.

As shown in FIG. 2, the slide rail assembly 20 includes a first rail 30, a second rail 32, and a third rail 34. The first rail 30, on which the first bracket 26a and the second bracket 26b are arranged, has a front end 36a, a rear end 36b, and a first channel 38 between the front end 36a and the rear end 36b. Preferably, the first rail 30 also has at least one contact portion 40, such as two projections, adjacent to the rear end 36b. In this embodiment, the slide rail assembly 20 further includes a first stopping member 42 and a second stopping member 44. The first stopping member 42 can be arranged adjacent to the rear end 36b of the first rail 30, and the second stopping member 44 can be arranged away from the rear end 36b of the first rail 30. The second rail 32 is mounted to the first channel 38 of the first rail 30. The second rail 32 has a front end 46a, a rear end 46b, and a second channel 48 between the front end 46a and the rear end 46b. Preferably, the slide rail assembly 20 further includes a first engaging mechanism 50, a second engaging mechanism 52, a third engaging mechanism 54, and a stopping base 56. The first engaging mechanism 50, the second engaging mechanism 52, and the third engaging mechanism 54 are all mounted on the second rail 52 but at different positions. For instance, the second engaging mechanism 52 is located between the first engaging mechanism 50 and the third engaging mechanism 54 while the first engaging mechanism 50 is adjacent to the rear end 46b of the second rail 32. The first engaging mechanism 50 includes a first engaging member 58 and a first elastic member 60 for applying an elastic force to the first engaging member 58. The second engaging mechanism 52 includes a second engaging member 62 and a second elastic member 64 for applying an elastic force to the second engaging member 62. The third engaging mechanism 54 includes a third engaging member 66 and a third elastic member 68 for applying an elastic force to the third engaging member 66. Preferably, a first pivotal connection member 70, a second pivotal connection member 72, and a third pivotal connection member 74 are also included to pivotally connect the first engaging member 58, the second engaging member 62, and the third engaging member 66 to the second rail 32 respectively. The stopping base 56 (as can be seen more clearly in FIG. 3) is arranged on the second rail 32, e.g., at a position adjacent to the front end 46a of the second rail 32. The stopping base 56 has a stopping portion 76.

The third rail 34 is mounted to the second channel 48 of the second rail 32 and is configured to carry the object 22 (not shown in FIG. 2). As the carrying mechanism is well known in the art, no further description is provided herein for the sake of simplicity.

Figure 4:
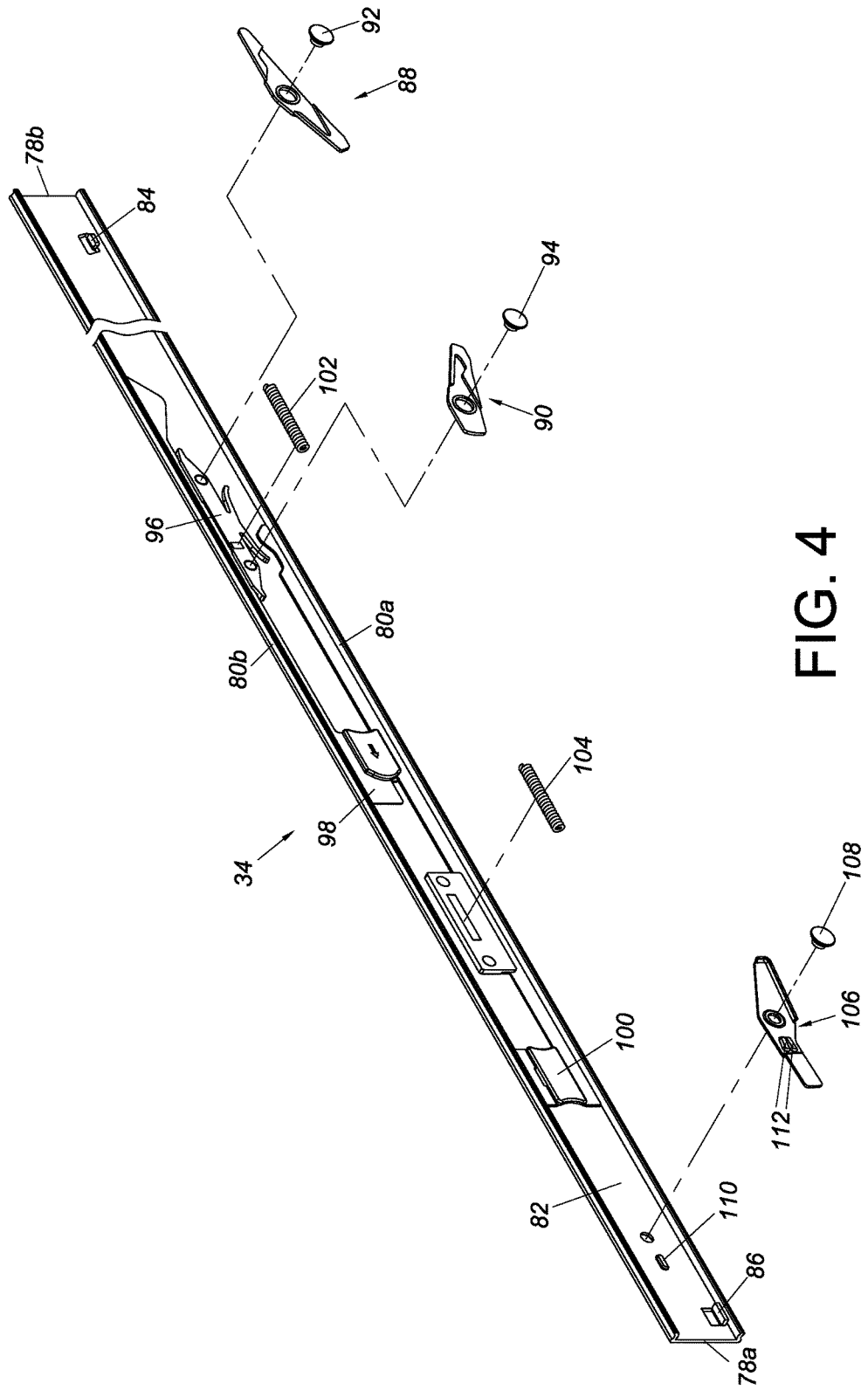
FIG. 4 is an exploded perspective view of the third rail, the first working member, the second working member, the switching member, and the two auxiliary elastic members of the slide rail assembly in FIG. 2.
Figure 5:
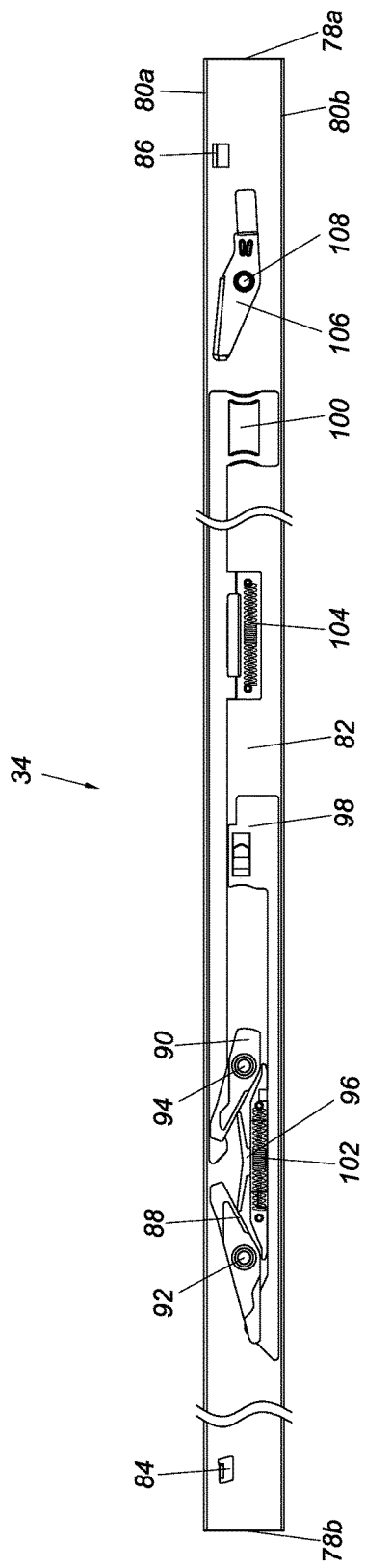
FIG. 5 shows the third rail in FIG. 4 in the assembled state.

As shown in FIG. 4 and FIG. 5, the third rail 34 has a front end 78a and a rear end 78b. The third rail 34 includes an upper wall 80a, a lower wall 80b, and a longitudinal wall 82 connected between the upper wall 80a and the lower wall 80b. (Please note that the third rail 34 is shown upside down in FIG. 5 as compared with FIG. 4, and that therefore all its components, including the upper wall 80a and the lower wall 80b, are vertically inverted in FIG. 5 as compared with FIG. 4.) The third rail 34 has a rear stop 84 and a front stop 86. The rear stop 84 is adjacent to the rear end 78b of the third rail 34. The front stop 86 is adjacent to the front end 78a of the third rail 34. In this embodiment, both the rear stop 84 and the front stop 86 are projections by way of example.

Preferably, a first working member 88 and a second working member 90 are also included and are mounted on the longitudinal wall 82 of the third rail 34. In this embodiment, a fourth pivotal connection member 92 and a fifth pivotal connection member 94 are further included to pivotally connect the first working member 88 and the second working member 90 to the longitudinal wall 82 of the third rail 34 respectively.

This embodiment further includes an elastic base 96, a first operation member 98, a second operation member 100, a first auxiliary elastic member 102, and a second auxiliary elastic member 104. The elastic base 96 is connected to the longitudinal wall 82 of the third rail 34 in order to elastically support at least a portion of the first working member 88 and at least a portion of the second working member 90. The first operation member 98 and the second operation member 100 can be used to operate the first working member 88 and the second working member 90 respectively. The first auxiliary elastic member 102 and the second auxiliary elastic member 104 are configured to apply an elastic force to the first operation member 98 and the second operation member 100 respectively. It is preferable that a switching member 106 is also included and is mounted on the third rail 34. The switching member 106 and the front stop 86 are spaced by a longitudinal distance. More specifically, the switching member 106 is movably connected, e.g., pivotally connected by a sixth pivotal connection member 108, to the longitudinal wall 82 of the third rail 34. Preferably, the third rail 34 further has a supporting feature 110, and the switching member 106 has two switching features 112. The supporting feature 110 supports a different one of the switching features 112 when the switching member 106 is in one of different positions. The supporting feature 110 and the two switching features 112 are corresponding structures, e.g., a recess and two projections, a projection and two recesses, or a projection and another two projections, respectively.

Figure 6:
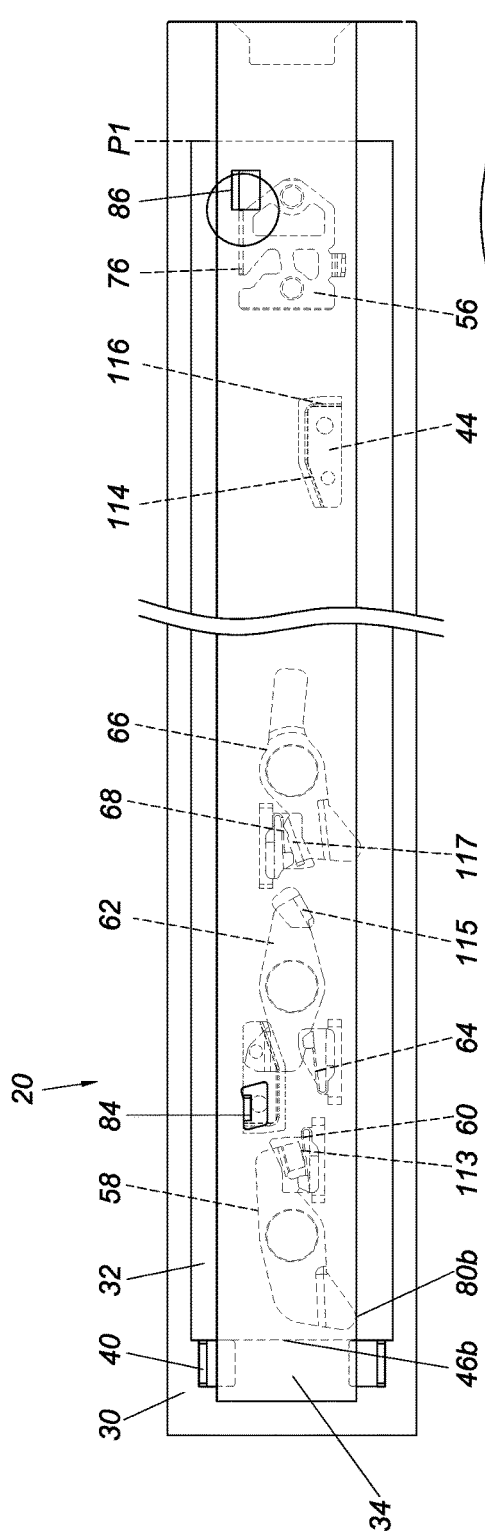
FIG. 6 shows the slide rail assembly in FIG. 2 in a retracted state, in which the first engaging mechanism, the second engaging mechanism, and the third engaging mechanism are each in a predetermined state.
Figure 7:
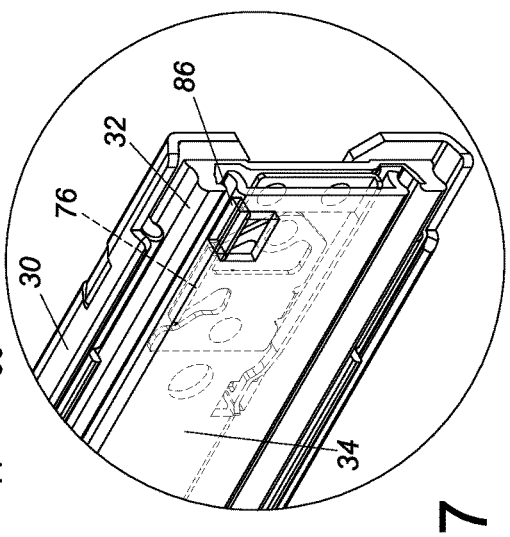
FIG. 7 is a partial perspective view of FIG. 6, showing the front stop of the third rail pressed against the stopping base.

As shown in FIG. 6, the first engaging member 58, the second engaging member 62, and the third engaging member 66 respectively have a first extension 113, a second extension 115, and a third extension 117. The first extension 113, the second extension 115, and the third extension 117 all extend through the second rail 32 and correspond to the first rail 30. The second stopping member 44 includes a disengaging portion 114 and a position-limiting portion 116, wherein the position-limiting portion 116 extends from and is bent with respect to the disengaging portion 114. The disengaging portion 114 may be an inclined or curved surface. When the slide rail assembly 20 is in a retracted state, the second rail 32 is retracted with respect to the first rail 30 and is at a first position P1, where the rear end 46b of the second rail 32 is pressed against the at least one contact portion 40 of the first rail 30. On the other hand, the third rail 34 is also retracted with respect to the second rail 32, with the front stop 86 of the third rail 34 pressed against the stopping portion 76 of the stopping base 56 of the second rail 32 (as can be seen more clearly in FIG. 7). In particular, two opposite portions of the first engaging member 58 are supported by the first elastic member 60 and the third rail 34 (e.g., the lower wall 80b of the third rail 34) respectively and are therefore kept in a predetermined state. The second engaging member 62 and the third engaging member 66, on the other hand, are each kept in a predetermined state by the elastic force provided by the corresponding one of the second elastic member 64 and the third elastic member 68.

The second engaging member 62 corresponds in position to the rear stop 84 of the third rail 34 when in the predetermined state. In this embodiment, the rear stop 84 is spaced from the second engaging member 62, and the second extension 115 of the second engaging member 62 corresponds in position to the disengaging portion 114 of the second stopping member 44. When the third engaging member 66 is in the predetermined state, the third extension 117 of the third engaging member 66 corresponds in position to the disengaging portion 114 of the second stopping member 44.

Figure 8:
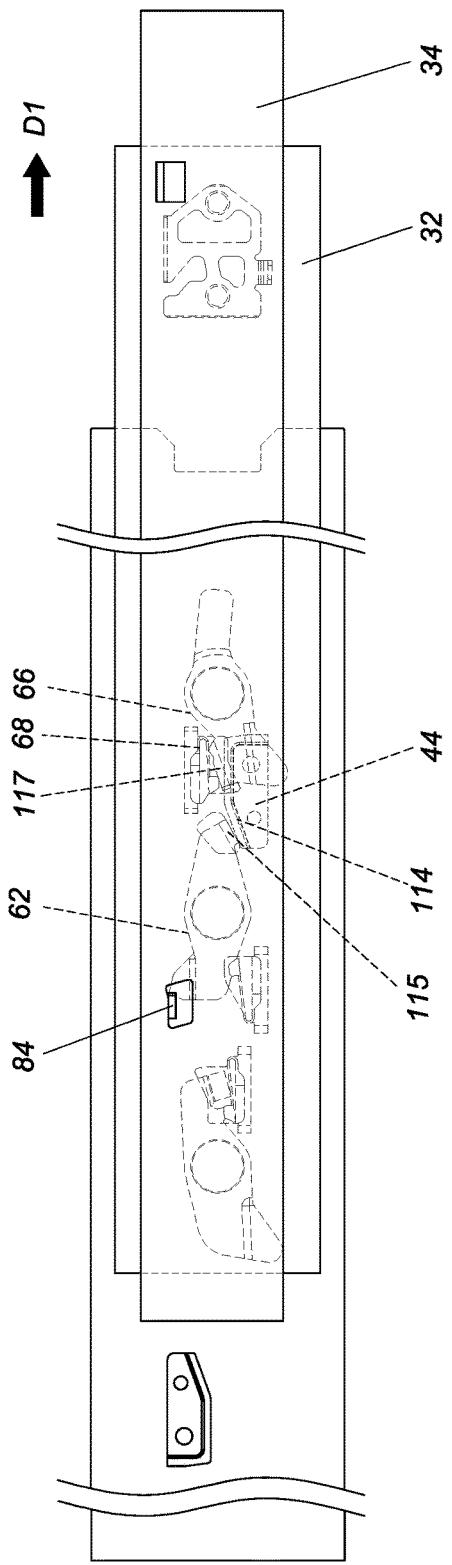
FIG. 8 shows how the third rail of the slide rail assembly in FIG. 6 pushes the second engaging member of the second engaging mechanism via the rear stop and thereby displaces the second rail in a first direction.

Referring to FIG. 8, when the third rail 34 is displaced in a first direction D1 with respect to the second rail 32, the third rail 34 pushes the second engaging member 62 via the rear stop 84 and thus displaces the second rail 32 from the first position P1 in the first direction D1. When the third rail 34 reaches a certain position, the third extension 117 of the third engaging member 66 is guided by the disengaging portion 114 of the second stopping member 44 and is consequently pressed against the second stopping member 44. The third elastic member 68 stores an elastic force as a result, with the second extension 115 of the second engaging member 62 in contact with the disengaging portion 114 of the second stopping member 44.

Referring to FIG. 9, when the third rail 34 is further displaced to a predetermined position in the first direction D1, the second engaging member 62 is tilted by an angle under the guidance of the disengaging portion 114 of the second stopping member 44 and is thereby disengaged from the rear stop 84 of the third rail 34, releasing the second rail 32 from the simultaneous displacement relationship with the third rail 34. The second rail 32 in this state reaches a second position P2 with respect to the first rail 30, and the third engaging member 66, after moving past the second stopping member 44, is tilted by an angle in response to the elastic force of the third elastic member 68 and is adjacent to the position-limiting portion 116 of the second stopping member 44, allowing the second rail 32 to stay temporarily at the second position P2. Moreover, as the third rail 34 is further displaced with respect to the second rail 32 in the first direction D1, the first engaging member 58 is no longer supported by the third rail 34 (e.g., by the lower wall 80b of the third rail 34), is tilted by an angle in response to the elastic force of the first elastic member 60, and hence corresponds to the first stopping member 42.

More particularly, with continued reference to FIG. 9, the first rail 30, the second rail 32, and the third rail 34 define a first length L1 when the third rail 34 is displaced in the first direction D1 to a third position P3 (e.g., an extended position) with respect to the second rail 32, where the front end 78a of the third rail 34 is accordingly moved beyond the front end 46a of the second rail 32. In other words, the first length L1 is defined between the rear end 36b of the first rail 30 and the front end 78a of the third rail 34.

Referring to FIG. 10, when the third rail 34 reaches the third position P3, the first working member 88 is in a first working position X1, where the first working member 88 is pressed against a side S1 of the stopping portion 76 of the stopping base 56. Furthermore, in the course in which the third rail 34 reaches the third position P3, the second working member 90 is displaced along the stopping portion 76 of the stopping base 56 and generates an elastic force. The second working member 90 releases the elastic force upon moving past the stopping portion 76 of the stopping base 56 and is consequently in a first working position Y1, where the second working member 90 is pressed against the opposite side S2 of the stopping portion 76 of the stopping base 56. The third rail 34 in this state can be neither extended nor retracted with respect to the second rail 32.

As shown in FIG. 11 and FIG. 12, an operator can apply a force F1 to displace the second operation member 100, thereby tilting the second working member 90 by an angle from the first working position Y1 to a second working position Y2, where the second working member 90 is not pressed against the side S2. The third rail 34 in this state can be retracted in a second direction D2 with respect to the second rail 32.

Figure 13:
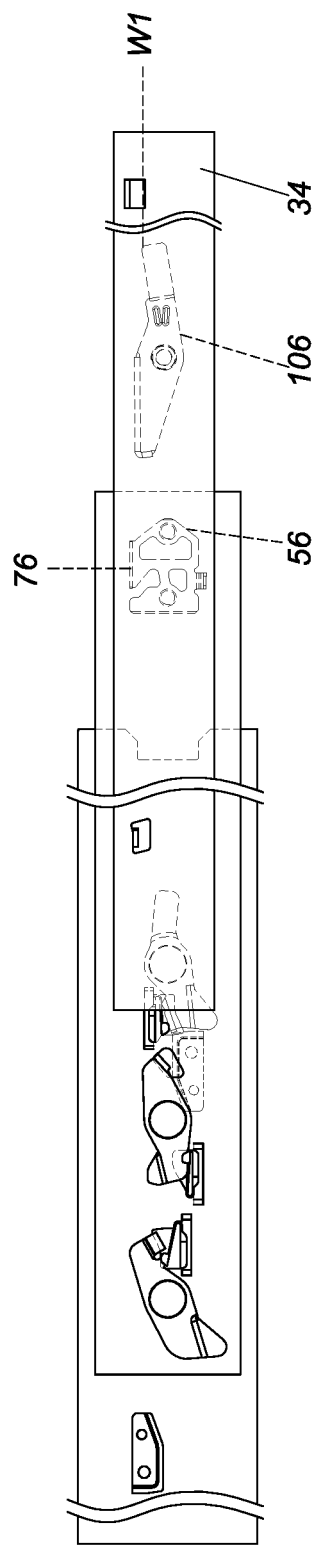
FIG. 13 shows the third rail of the slide rail assembly in FIG. 2 at an extended position with respect to the second rail, with the switching member in a first switching position.
Figure 14:
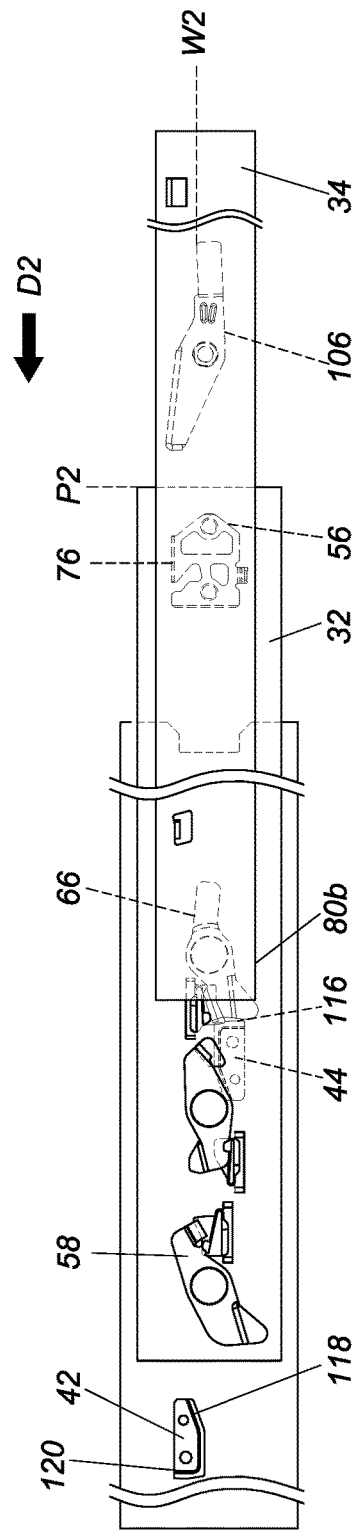
FIG. 14 is similar to FIG. 13, but with the switching member in a second switching position.

As shown in FIG. 13 and FIG. 14, an operator can displace the switching member 106 from a first switching position W1 to a second switching position W2 by operating the switching member 106. The switching member 106 is not aligned with the stopping portion 76 of the stopping base 56 when in the first switching position W1 but is when in the second switching position W2.

Referring to FIG. 14, when the third rail 34 is displaced from an extended position to a certain position in the second direction D2 with respect to the second rail 32, the third rail 34 (e.g., the lower wall 80b of the third rail 34) pushes the third engaging member 66 such that the third engaging member 66 is tilted by an angle and is disengaged from the position-limiting portion 116 of the second stopping member 44.

As shown in FIG. 14 and FIG. 15, the first stopping member 42 has a guiding portion 118 and an engaging portion 120 extending from and bent with respect to the guiding portion 118, wherein the guiding portion 118 may be an inclined or curved surface. When the third rail 34 is further displaced in the second direction D2, the switching member 106 (now in the second switching position W2) on the third rail 34 pushes the side S2 of the stopping portion 76 of the stopping base 56 (as can be seen more clearly in FIG. 16) such that the second rail 32 is displaced along with the third rail 34 in the second direction D2 from the second position P2. During the displacement in the second direction D2, the first engaging member 58 is tilted by an angle under the guidance of the guiding portion 118 and is pressed against the engaging portion 120 of the first stopping member 42 in response to the elastic force of the first elastic member 60, thus keeping the second rail 32 at a fourth position P4, such as a retracted position. The second rail 32 in this state cannot be displaced with respect to the first rail 30 in the second direction D2 or the first direction D1, which is the opposite direction of the second direction D2.

Now that it is the switching member 106, rather than the front stop 86 of the third rail 34, that is adjacent to the side S2 of the stopping portion 76 of the stopping base 56, the rear stop 84 of the third rail 34 is spaced from the second engaging member 62 when the third rail 34 is retracted with respect to the second rail 32, meaning the second rail 32 will not be displaced along with the third rail 34.

Figure 17:
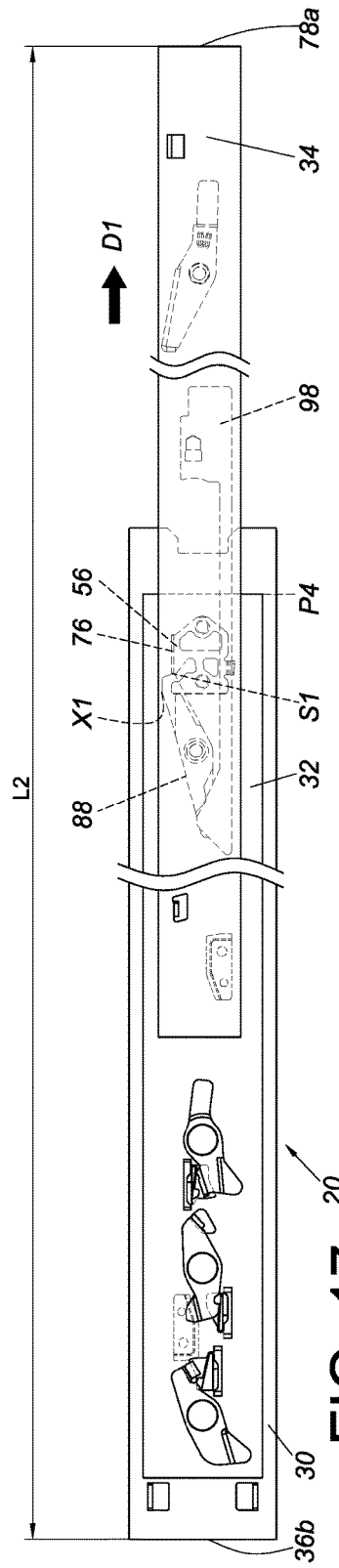
FIG. 17 shows the second rail in FIG. 15 at the same position with respect to the first rail, and yet the third rail has been displaced with respect to the second rail in the first direction until the first working member is pressed against the stopping portion of the stopping base.

Referring to FIG. 17, when the second rail 32 is at the fourth position P4, the third rail 34 can be displaced with respect to the second rail 32 in the first direction D1 until the first working member 88 is pressed against the side S1 of the stopping portion 76 of the stopping base 56. When the first working member 88 is pressed against the side S1 of the stopping portion 76 of the stopping base 56, the rear end 36b of the first rail 30 and the front end 78a of the third rail 34 define a second length L2 therebetween. The second length L2 is shorter than the first length L1 (see FIG. 9). In other words, the first length L1 can be reduced to the second length L2 by retracting the second rail 32 to the fourth position P4 with respect to the first rail 30.

Figure 18:
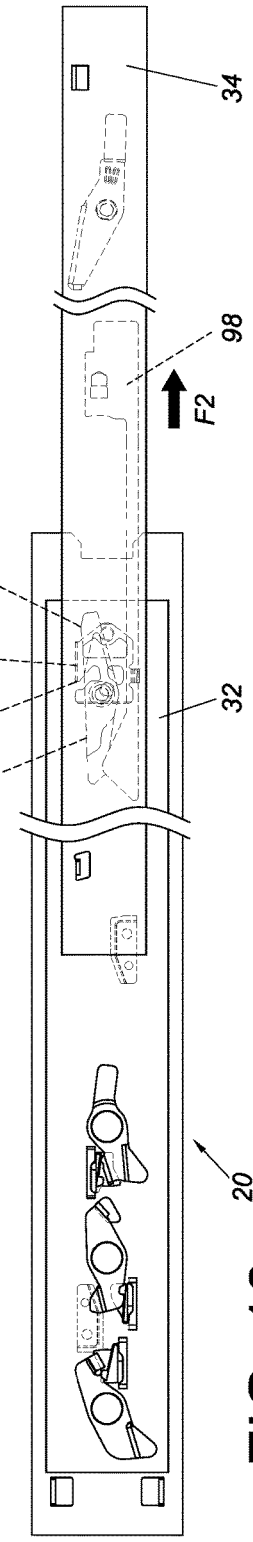
FIG. 18 shows the first working member in FIG. 17 disengaged from the stopping portion of the stopping base.
Figure 19:
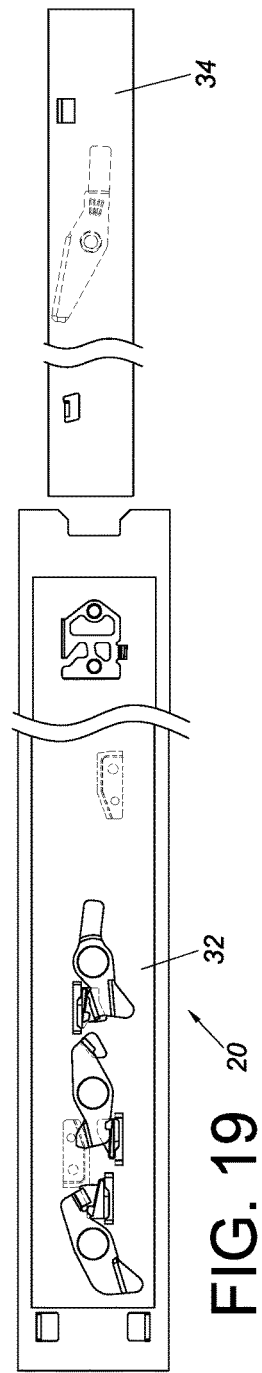
FIG. 19 shows how the third rail in FIG. 18 is detached with respect to the second rail.

When the second length L2 is the case, referring to FIG. 18 and FIG. 19, an operator can apply a force F2 to displace the first operation member 98, thereby displacing the first working member 88 from the first working position X1 to a second working position X2. The first working member 88, when being displaced to the second working position X2, is disengaged from the side S1 of the stopping portion 76 of the stopping base 56, allowing the third rail 34 to be detached with respect to the second rail 32.

When the slide rail assembly 20 is used in a space-limited environment as shown in FIG. 20 and is in an extended state in which the slide rail assembly 20 is spaced from an ambient object 122 (e.g., a door or wall) by a first space d1, the first space d1 may be too narrow for an operator to perform maintenance work on the slide rail assembly 20 (e.g., to remove the third rail 34).

As a solution, referring to FIG. 21, the operator can follow the foregoing operation method, retracting the second rail 32 with respect to the first rail 30 and having the second rail 32 temporarily engaged with the first rail 30, thereby shortening the overall length of the slide rail assembly 20. By doing so, a second space d2 is created between the slide rail assembly 20 and the ambient object 122, wherein the second space d2 is wider than the first space d1 and provides more room for use by the operator to facilitate maintenance of the slide rail assembly 20, including detaching the third rail 34 from the second rail 32.

The present invention also provides a method for operating a slide rail assembly as disclosed by way of the foregoing embodiment. For the sake of simplicity, the method will not be described repeatedly herein.

It should be understood that, while the present invention has been disclosed through the embodiment described above, the embodiment is not intended to be restrictive of the scope of the invention. The scope of patent protection sought by the applicant is defined by the appended claims.

What is claimed is:

1. A slide rail assembly, comprising:
   a first rail having a front end and a rear end;
   a second rail displaceable with respect to the first rail;
   a third rail displaceable with respect to the second rail, the third rail having a front end and a rear end;
   a first engaging mechanism movably mounted on the second rail;
   at least one stopping member arranged on the first rail and including a disengaging portion; and
   a second engaging mechanism movably mounted on the second rail, the third rail including a rear stop and being configured to push the second engaging mechanism via the rear stop and thereby displace the second rail from a first position in a first direction, and the disengaging portion of the at least one stopping member disengages the second engaging mechanism from the rear stop when the third rail is displaced to a predetermined position;
   wherein the rear end of the first rail and the front end of the third rail define a first length therebetween when the second rail is displaced from the first position to the second position with respect to the first rail in the first direction and the third rail is displaced to a third position with respect to the second rail in the first direction and therefore extends out of the second rail;
   wherein when the second rail is displaced from the second position to a fourth position in a second direction, the first length between the rear end of the first rail and the front end of the third rail is reduced to a second length, and the second rail is kept at the fourth position with respect to the first rail by the first engaging mechanism.

2. The slide rail assembly of claim 1, further comprising a first working member and a stopping base, wherein the first working member is mounted on the third rail and is displaceable between a first working position and a second working position by user operation, the stopping base is arranged on the second rail and has a stopping portion, the first working member is in the first working position and is pressed against a side of the stopping portion of the stopping base when the third rail is displaced to a predetermined position in the first direction, and the first working member is no longer pressed against the stopping portion of the stopping base when the first working member is displaced from the first working position to the second working position by user operation, thus allowing the third rail to be detached with respect to the second rail.

3. The slide rail assembly of claim 2, further comprising a second working member elastically mounted on the third rail, wherein the second working member is displaced along the stopping portion of the stopping base while the third rail is being displaced to the predetermined position in the first direction, and the second working member is pressed against another side of the stopping portion of the stopping base after moving past the stopping portion of the stopping base.

4. The slide rail assembly of claim 1, further comprising another stopping member arranged on the first rail, wherein the second rail is pressed against the other stopping member via the first engaging mechanism when at the fourth position.

5. The slide rail assembly of claim 4, wherein the first engaging mechanism includes a first engaging member and a first elastic member for applying an elastic force to the first engaging member, and the first engaging member is pressed against the other stopping member by the elastic force of the first elastic member when the second rail is at the fourth position.

6. The slide rail assembly of claim 1, wherein the second engaging mechanism includes a second engaging member and a second elastic member for applying an elastic force to the second engaging member, and the third rail is configured to push the second engaging member via the rear stop.

7. The slide rail assembly of claim 1, further comprising a third engaging mechanism movably mounted on the second rail, wherein the at least one stopping member includes a position-limiting portion, and the third engaging mechanism is adjacent to the position-limiting portion of the second stopping member when the second rail is displaced to the second position.

8. The slide rail assembly of claim 7, wherein the third engaging mechanism includes a third engaging member and a third elastic member for applying an elastic force to the third engaging member, and the third engaging member is adjacent to the position-limiting portion of the at least one stopping member in response to the elastic force of the third elastic member when the second rail is displaced to the second position.

9. A slide rail assembly, comprising:
   a first rail having a front end and a rear end;
   a second rail displaceable with respect to the first rail;
   a third rail displaceable with respect to the second rail, the third rail having a front end and a rear end;
   a first engaging mechanism movably mounted on the second rail;
   a first working member mounted on the third rail and being displaceable between a first working position and a second working position by user operation;

a stopping base arranged on the second rail and having a stopping portion, the first working member being in the first working position and pressed against a side of the stopping portion of the stopping base when the third rail is displaced to a predetermined position in a first direction, and the first working member being no longer pressed against the stopping portion of the stopping base when the first working member is displaced from the first working position to the second working position by user operation, thus allowing the third rail to be detached with respect to the second rail; and a switching member mounted on the third rail, wherein the switching member is displaceable between a first switching position and a second switching position by user operation, in which the switching member is not aligned with the stopping portion of the stopping base when in the first switching position but is aligned with the stopping portion of the stopping base when in the second switching position;

wherein the rear end of the first rail and the front end of the third rail define a first length therebetween when the second rail is displaced from a first position to a second position with respect to the first rail in a first direction and the third rail is displaced to a third position with respect to the second rail in the first direction and therefore extends out of the second rail; and wherein when the second rail is displaced from the second position to a fourth position in a second direction, the first length between the rear end of the first rail and the front end of the third rail is reduced to a second length, and the second rail is kept at the fourth position with respect to the first rail by the first engaging mechanism.

10. The slide rail assembly of claim 9, wherein the third rail has a front stop spaced from the switching member.

11. A slide rail assembly adapted for mounting an object to a rack, the slide rail assembly comprising:
a first rail mountable on the rack, the first rail having a front end and a rear end;
a second rail displaceable with respect to the first rail;
a third rail displaceable with respect to the second rail, the third rail being configured to carry the object and having a front end and a rear end;
a first stopping member arranged on the first rail;
a first engaging mechanism movably mounted on the second rail;
a first working member mounted on the third rail, the first working member being displaceable between a first working position and a second working position by user operation;
a second stopping member arranged on the first rail and including a disengaging portion; and
a second engaging mechanism movably mounted on the second rail, the third rail including a rear stop and being configured to push the second engaging mechanism via the rear stop and thereby displace the second rail from a first position in a first direction, and the disengaging portion of the second stopping member disengages the second engaging mechanism from the rear stop when the third rail is displaced to a predetermined position;
wherein the rear end of the first rail and the front end of the third rail define a first length therebetween when the second rail is displaced from the first position to a second position with respect to the first rail in the first direction and the third rail is displaced to a third position with respect to the second rail in the first direction and therefore extends out of the second rail;
wherein when the second rail is displaced from the second position to a fourth position in a second direction, the first length between the rear end of the first rail and the front end of the third rail is reduced to a second length, and the second rail is kept at the fourth position with respect to the first rail by the first engaging mechanism;
wherein the third rail is detachable with respect to the second rail when the first working member is displaced from the first working position to the second working position by user operation.

12. A method for operating a slide rail assembly, comprising the steps of:
providing a first rail;
providing a second rail displaceable from a first position to a second position with respect to the first rail in a first direction;
providing a third rail displaceable with respect to the second rail to a third position beyond the second position;
providing a first working member displaceable between a first working position and a second working position by user operation, wherein when the first working member is in the first working position, the third rail is at the third position with respect to the second rail such that the first rail, the second rail, and the third rail define a first length;
providing a first engaging mechanism such that, when the second rail is displaced from the second position to a fourth position with respect to the first rail in a second direction, the first engaging mechanism keeps the second rail at the fourth position with respect to the first rail, thereby reducing the first length to a second length;
displacing the first working member from the first working position to the second working position by user operation when the second length prevails, so that the third rail is detachable with respect to the second rail; and
providing a at least one stopping member arranged on the first rail and including a disengaging portion; and
providing a second engaging mechanism movably mounted on the second rail, the third rail including a rear stop and being configured to push the second engaging mechanism via the rear stop and thereby displace the second rail from the first position in the first direction, and the disengaging portion of the at least one stopping member disengages the second engaging mechanism from the rear stop when the third rail is displaced to a predetermined position.

13. The method of claim 12, wherein the step of providing the first working member includes providing a stopping base to the second rail, and the stopping base has a stopping portion such that, when the third rail is so displaced in the first direction that the first working member is in the first working position, the first working member is pressed against a side of the stopping portion of the stopping base.

14. The method of claim 12, further comprising the step of providing another stopping member to the first rail such that the second rail is pressed against the other stopping member via the first engaging mechanism when at the fourth position.

* * * * *